(12) United States Patent
Qi et al.

(10) Patent No.: US 10,481,462 B2
(45) Date of Patent: Nov. 19, 2019

(54) SIGNAL CONTROL FOR SEGMENTED MODULATORS

(71) Applicant: Hewlett Packard Enterprise Development LP, Houston, TX (US)

(72) Inventors: Nan Qi, Palo Alto, CA (US); Cheng Li, Palo Alto, CA (US); Marco Fiorentino, Mountain View, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 25 days.

(21) Appl. No.: 15/768,893

(22) PCT Filed: Oct. 27, 2015

(86) PCT No.: PCT/US2015/057608
§ 371 (c)(1),
(2) Date: Apr. 17, 2018

(87) PCT Pub. No.: WO2017/074318
PCT Pub. Date: May 4, 2017

(65) Prior Publication Data
US 2019/0235345 A1 Aug. 1, 2019

(51) Int. Cl.
*G02F 1/21* (2006.01)
*H03K 5/135* (2006.01)
*H03K 5/00* (2006.01)
*H03M 9/00* (2006.01)

(52) U.S. Cl.
CPC ............... *G02F 1/21* (2013.01); *H03K 5/135* (2013.01); *G02F 2001/212* (2013.01); *H03K 2005/00052* (2013.01); *H03M 9/00* (2013.01)

(58) Field of Classification Search
CPC .............................. G02F 1/21; G02F 2001/212
See application file for complete search history.

(56) References Cited

U.S. PATENT DOCUMENTS

| 5,291,565 | A | 3/1994 | Schaffner et al. |
| 7,317,846 | B2 | 1/2008 | Keil |
| 8,530,821 | B2 | 9/2013 | Green et al. |
| 8,744,219 | B2 | 6/2014 | Kato |
| 2010/0239264 | A1* | 9/2010 | Yang .................... H04B 10/505 398/98 |

(Continued)

FOREIGN PATENT DOCUMENTS

JP 2009206929 9/2009

OTHER PUBLICATIONS

Lopez, G. et al., "A 2.5 Vppd Broadband 32 GHz BiCMOS Linear Driver with Tunable Delay Line for InP Segmented Mach-Zehnder Modulators," (Research Paper), Apr. 20, 2015, 4 pages.

*Primary Examiner* — Joseph P Martinez
(74) *Attorney, Agent, or Firm* — Hewlett Packard Enterprise Patent Department

(57) ABSTRACT

In example implementations, an apparatus includes a serializer, a re-timing buffer coupled to the serializer, and a plurality of segments coupled to the re-timing buffer. The plurality of segments may be used for controlling a timing of an electrical signal. Each one of the plurality of segments may include a segment serializer, a timing control coupled to the segment serializer and a driver coupled to the timing control. In addition, a phase clock may be coupled to the segment serializer and the timing control of each one of the plurality of segments.

15 Claims, 4 Drawing Sheets

(56) References Cited

U.S. PATENT DOCUMENTS

| | | |
|---|---|---|
| 2011/0176816 A1 | 7/2011 | Ooi et al. |
| 2014/0029956 A1 | 1/2014 | Le Taillandier De Gabory et al. |
| 2014/0169802 A1 | 6/2014 | Magri et al. |
| 2014/0199014 A1 | 7/2014 | Velthaus et al. |

* cited by examiner

SIGNAL CONTROL FOR SEGMENTED MODULATORS

STATEMENT OF GOVERNMENT INTEREST

This invention was made with government support under Contract No. H98230-14-3-0011. The government has certain rights in this invention.

BACKGROUND

A Mach-Zehnder modulator (MZM) is an electro-optic modulator that can be incorporated into integrated circuits. The MZM can be used to determine relative phase shift variations between two beams derived by splitting light from a single source. The MZM offers a well-behaved, high bandwidth electro-optic amplitude and phase response over multiple frequency ranges.

DETAILED DESCRIPTION

The present disclosure discloses a Mach Zehnder Modulator (MZM) driver that has been modified to provide precise signal propagation control to each segment of an MZM. Currently MZM driver designs use a physical delay by changing a termination resistance and changing a width of an electrode metal trace within the transmission lines of the MZM driver. However, the MZM driver usually features a large physical length and experiences a severe electrical signal loss along the entire length of the MZM driver.

Another MZM driver design uses a pre-determined delay before the signal is distributed within the MZM. However, the delay of this design is based on a bandwidth limitation, which means sacrificing the signal integrity for the desired delay. Eventually, a compensation is applied for the bandwidth through boosting or equalization, which draws additional power thereby causing inefficiency. In addition, the delay of the active and passive elements used to implement the pre-determined delay may change due to process and temperature variation, which can be difficult to precisely regulate.

Examples of the present disclosure use a clock signal to control the electrical signal delivered by the MZM driver to a segmented MZM that eliminates the signal loss due to long transmission lines. Each segment of the MZM may be driven separately. In addition, the delay is controlled within each segment locally by a tunable phase clock. As a result, a precise time delay may be introduced in each segment of the MZM based on the tunable phase clock of the MZM driver.

Figure 1:
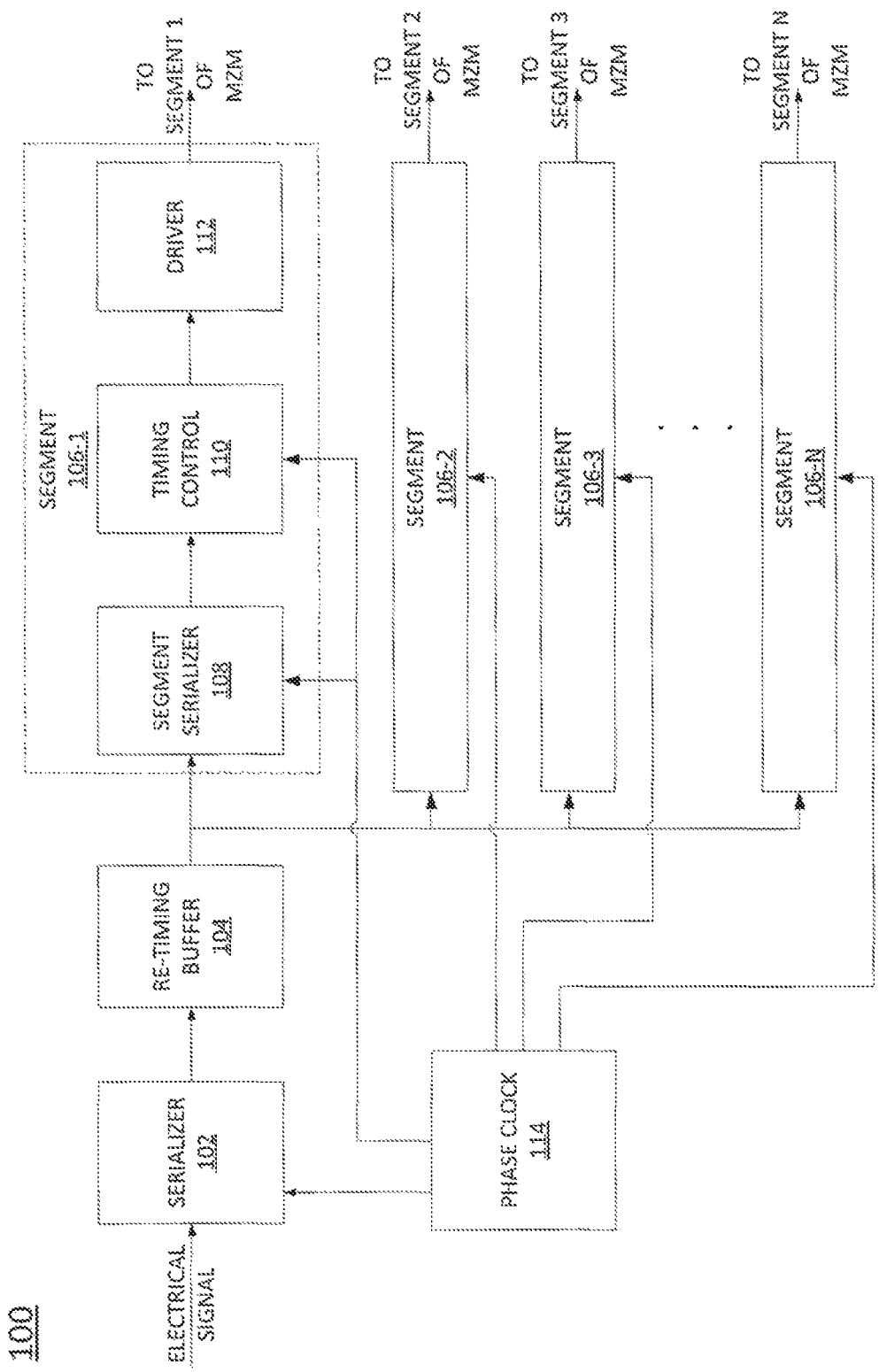
FIG. 1 is a block diagram of an example apparatus of the present disclosure.

FIG. 1 illustrates an example apparatus 100 of the present disclosure. The apparatus 100 may be a Mach Zehnder Modulator (MZM) driver that delivers an electrical signal to a plurality of segments of the MZM. For example, by breaking up the MZM into a plurality of segments, the electrical signals may travel a shorter distance in each segment resulting in less electrical signal loss along the entire length of the MZM.

In one example, the apparatus 100 may include a serializer 102, a re-timing buffer 104, a plurality of segments 106-1 to 106-n (hereinafter referred to individually as a segment 106 or collectively as segments 106) and a phase clock 114. In one example, each one of the segments 106-1 to 106-n may also include a segment serializer 108, a timing control 110 and a driver 112.

In one example, the phase clock 114 may be comprised of a plurality of different lines that each represents a different phase (e.g., 0 degrees, 90 degrees, 180 degrees, 270 degrees, and the like) of the phase clock 114 and be distributed into a long MZM with multiple segments. In one example, the segment serializer 108 of two or more of the segments 106-1 to 106-n may be coupled to a different line of the phase clock 114. For example, the segment serializer 108 of the segment 106-1 may be coupled to a phase 0 clock line of the phase clock 114, the segment serializer 108 of the segment 106-2 may be coupled to a phase 90 clock line of the phase clock 114, and so forth.

The output from the driver 112 may be fed to a respective segment of the MZM. For example, the output from the driver 112 in the segment 106-1 may go to the segment 1 of the MZM, the output from the driver 112 in the segment 106-2 may go to the segment 2 of the MZM, and so forth.

In one example, the timing control 110 may define an arrival time of the electrical signal to the driver 112 in segment 106-1. The timing control in the segment 106-2 may define an arrival time of the electrical signal to the driver in the segment 106-2, and so forth. The difference in the arrival time of the electrical signal to the driver in the segment 106-2 from the arrival time of the electrical signal to the driver 112 in the segment 106-1 may be equivalent to a delay to output that is sent to the segment 2 of the MZM. The delay may be applied to the electrical signal of the segment 106-1 to align the electrical signal with an optical signal that travels through the MZM.

The delay may be calculated similarly for all adjacent or neighboring segments 106-1 to 106-n. For example, a delay between segment 106-2 and 106-3 may be calculated as described above, the delay between segment 106-3 and segment 106-4 may be calculated as described above, and so forth. The timing control 110 may include a timing regulator and a phase interpolator, discussed in further detail below in FIG. 2.

The timing control 110 of each segment 106-1 to 106-n may be programmed in accordance with an amount of delay that is measured. For example, the amount of demanded electrical delay between two adjacent or neighboring segments 106 may be measured. In one example, the amount of delay may be measured by measuring a traveling time of the optical signal on each one of the segments of the MZM that correspond to the segments 106-1 to 106-n of the MZM driver represented by the apparatus 100. The amount of delay that is measured may then be used to program or configure the timing control 110 to regulate arrival time of the electrical signal outputted by each segment 106-1 to 106-n at each MZM corresponding segment, thus, allowing the speed of the electrical signal to match the speed of the optical signal.

A difference in speed of the electrical signal and the optical signal may cause the signals to be out of phase. Thus, the apparatus 100 may help to match the speed of the electrical signal to the speed of the optical signal to ensure the signals are in phase. In one example, the delay may be added via a connection to at least one line of the phase clock 114.

In one implementation, the apparatus 100 may operate by distributing an electrical signal that is split into quarter rates of the electrical signal. In one example, the serializer 102 may combine quarter rates of the electrical signal into half rates. The serializer 102 may be regulated by the phase clock 114. The phase clock 114 may be a multi-phase clock. The re-timing buffer 104 may add a delay to one of the half rates of the electrical signal from the serializer 102. The half rates of the electrical signal may then be fed from the re-timing buffer 104 to each one of the plurality of segments 106-1 to 106-n.

The half rates may be combined into a full rate in each one of the segments 106-1 to 106-n by the respective segment serializer 108. The appropriate time delay may be added to full rate of the electrical signal in each one of the segments 106-1 to 106-n. The delayed full rate of the electrical signal may be sent to the respective driver 112 of the segments 106-1 to 106-n and sent to the respective segments 1 to n of the MZM.

Figure 2:
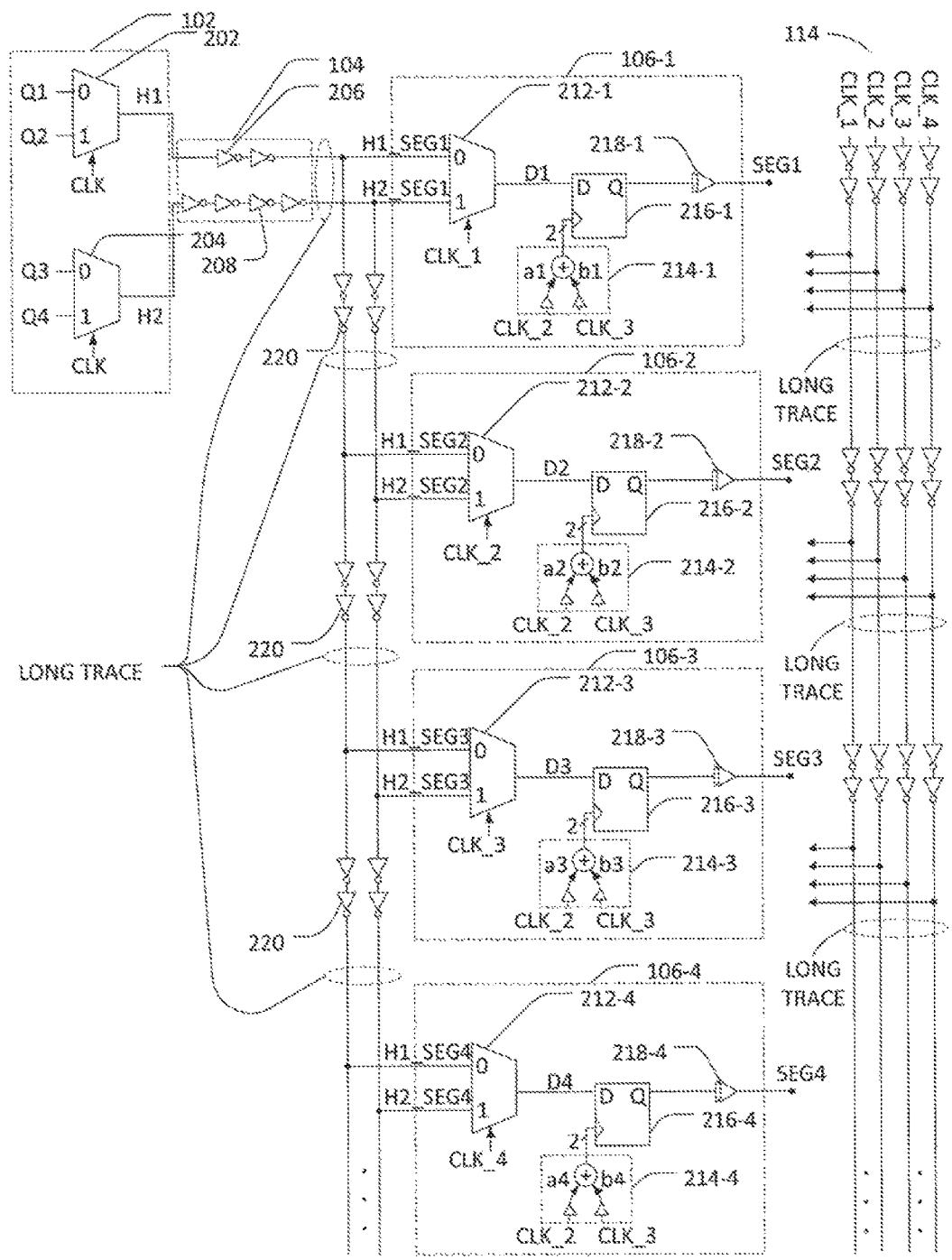
FIG. 2 is an example circuit diagram of the apparatus.

FIG. 2 illustrates a more detailed example circuit diagram 200 of the apparatus 100. It should be noted that FIG. 2 is one example of an implementation of the functions described with respect to the block diagram described in FIG. 1. In other words, other circuit configurations that achieve the same functions may be within the scope of the present disclosure.

In one example, four quarter rate data lines Q1, Q2, Q3 and Q4 of the electrical signal are fed to the serializer 102. In one example, the serializer 102 may comprise a first multiplexer 202 that combines Q1 and Q2 into a first half rate data line H1 of the electrical signal and a second multiplexer 204 that combines Q3 and Q4 into a second half rate data line H2 of the electrical signal. The first multiplexer 202 and the second multiplexer 204 may be set by a clock signal CLK.

In one example, H1 and H2 may be fed through the re-timing buffer 104 that includes a plurality of delay elements 206 for H1 and a plurality of delay elements 208 for H2. Each one of the delay elements 206 may represent a quarter unit interval delay. In one example, H2 may receive an additional half unit interval delay (e.g., H2 has four delay elements 208 versus two delay elements 206 in H1).

After the re-timing buffer 104, H1 and H2 may be distributed to each one of the plurality of segments 106-1 to 106-4. In one example, the segments 106-1 to 106-4 may also be referred to as a plurality of timing delay segments. H1 and H2 may travel along long trace lines between the re-timing buffer 104 and each buffer 220 on the way to each segment 106-1 to 106-4. Although FIG. 2 illustrates four segments 106, it should be noted that any number of n segments 106-n may be deployed.

In one example, the segment 106-1 may include a segment multiplexer 212-1, a phase interpolator 214-1, a dual-edge triggered flip-flop (DFF) 216-1 and a driver 218-1. The segments 106-2 to 106-4 may include similar components. For example, the segment 106-2 may include a segment multiplexer 212-2, a phase interpolator 214-2, a DFF 216-2 and a driver 218-2, and so forth.

In one example, the segment multiplexer 212 of at least two different segments 106 may be coupled to two different phase lines of the phase clock 114. To illustrate, the phase clock 114 may comprise a plurality of different clock phases CLK_1, CLK_2, CLK_3 and CLK_4. The plurality of different clock phases may be divided into any phase increment (e.g., 0 degrees, 90 degrees, 180 degrees, 270 degrees, and the like). In one implementation, the CLK_1 phase line may be aligned with the clock signal CLK and used to serialize H1 and H2 into a full rate line D1 to D4 of each one of the segments 106-1 to 106-n. In one example, the CLK_1 line may be coupled to the segment multiplexer 212-1 to serialize H1 and H2 into a full rate line D1, the CLK_2 line may be coupled to the segment multiplexer 212-2 to serialize H1 and H2 into a full rate line D2, the CLK_3 line may be coupled to the segment multiplexer 212-3 to serialize H1 and H2 into a full rate line D3, and the CLK_4 line may be coupled to the segment multiplexer 212-4 to serialize H1 and H2 into a full rate line D4. If additional segments 106 are added, the next segment multiplexer 212 may be coupled to the CLK_1 line and the pattern described above may be repeated.

The full rate lines D1-D4 may be fed to respective DFFs 216-1 to 216-4. The DFFs 216-1 to 216-4 may be used to regulate the arrival time of electrical signal of the full rate lines D1-D4 at segments of the MZM that correspond to the drivers 218-1 to 218-4. In one implementation, an input of the DFFs 216-1 to 216-4 may be coupled to an output of a respective phase interpolator 214-1 to 214-4. The electrical signal may be precisely controlled by the phase interpolators 214-1 to 214-4.

In one implementation, each one of the phase interpolators 214-1 to 214-4 may be configured with different coefficients to aggregate two phase clock lines coupled to the phase interpolators 214-1 to 214-4. For example, the phase interpolator 214-1 may have coefficients a1 and b1, the phase interpolator 214-2 may have coefficients a2 and b2, the phase interpolator 214-3 may have coefficients a3 and b3, and the phase interpolator 214-4 may have coefficients a4 and b4.

The coefficients may be weighting coefficients that weigh the two phase clock lines differently. For example, the CLK_2 line may be coupled to the coefficient a1 of the phase interpolator 214-1 and the CLK_3 line may be coupled to the coefficient b1 of the phase interpolator 214-1. The ratio of the coefficients a1 to b1 may be 3 to 1. The CLK_2 line may be coupled to the coefficient a2 of the phase interpolator 214-2 and the CLK_3 line may be coupled to the coefficient b2 of the phase interpolator 214-2. The ratio of the coefficients a2 to b2 may be 2 to 1. The coefficients a3 and b3 and a4 and b4 may be configured similarly and have different ratios.

It should be noted that although each phase interpolator is coupled to the same phase clock lines (e.g., CLK_2 and CLK_3) in FIG. 2, any phase clock lines may be used based on the amount of delay that is to be applied to the full rate lines D1-D4. In addition, the phase interpolators 214-1- to 214-4 may each have different phase clock lines.

As discussed above with respect to FIG. 1, the amount of delay may be measured based on a travelling time of the optical signal on each one of the segments of the MZM that correspond to the segments 106-1 to 106-4. Based on the measured delay, the appropriate phase clock lines and coefficient values may be configured or tuned in each one of the phase interpolators 214-1 to 214-4.

The phase difference of each two neighboring segments (e.g., segment 106-1 and 106-2) may correspond to a desired delay in the time domain. As a result, tuning the coefficients in the phase interpolators 214-1 to 214-4 as described above allows the time delay for the electrical signal to be precisely controlled.

In one implementation, the delay in each one of the segments 106-1 to 106-4 may be continuously monitored (e.g., by a controller or a processor (not shown) in communication with each one of the segments 106). If the measured delay changes, adjustments to the coefficients and/or the connected phase clock lines may be made in response to changes in the measured delay. For example, as the number of segments 106 are increased in the apparatus 100 and 200, the aggregated clock phase may pass that of the phase associated with the phase clock line (e.g., CLK_3 may be clock signal with a 180 degree phase). In that case, the phase clock lines that are input into the phase interpolators 214-1 to 214-4 may be changed to a phase clock line associated with a 180 phase and a 270 phase clock line, and so forth.

Figure 4:
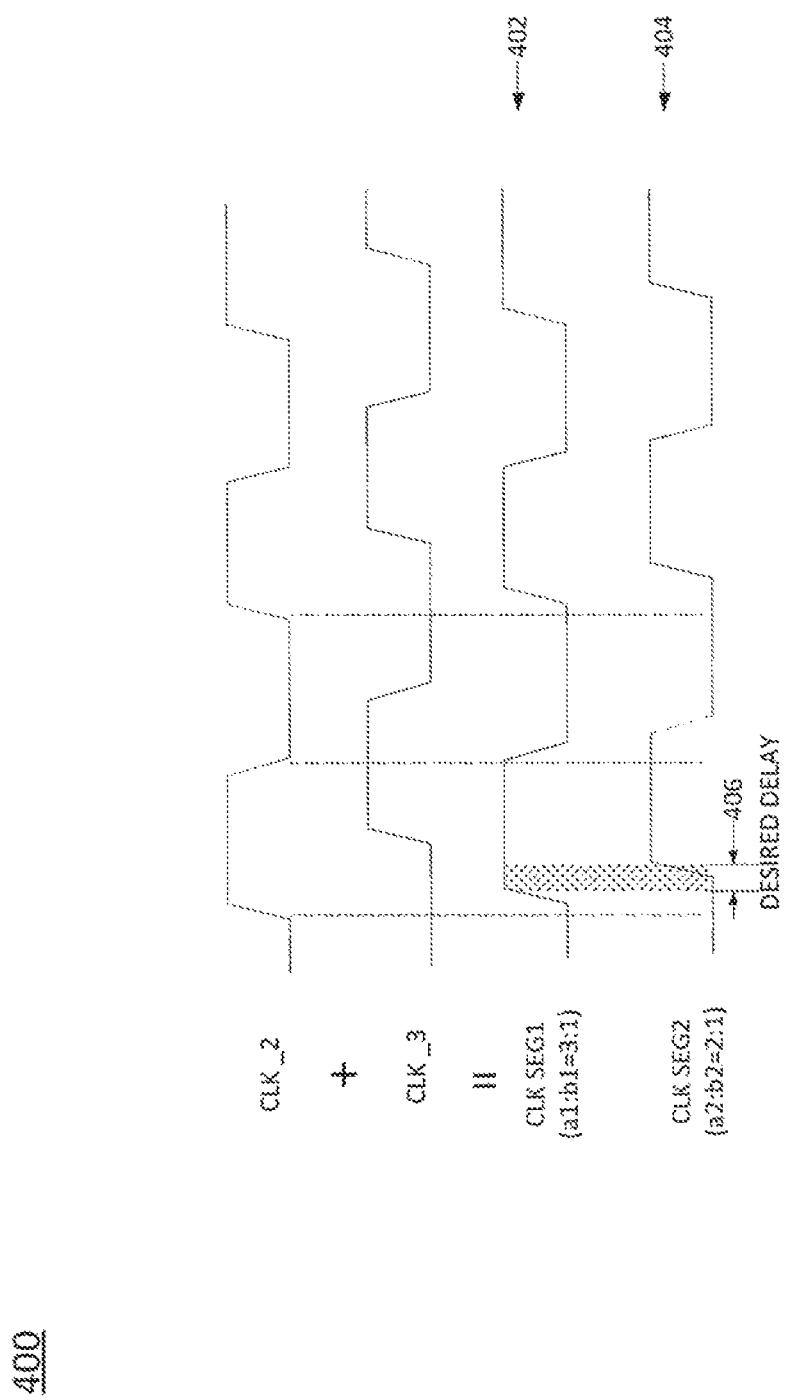
FIG. 4 is an example timing diagram of a phase interpolator.

FIG. 4 illustrates an example timing diagram 400 between the phase interpolator 214-1 and 214-2 of two adjacent segments 106-1 and 106-2. Using the above example, the ratio of the coefficients a1 and b1 in the phase interpolator 214-1 may be 3:1. The ratio of the coefficients a2 and b2 in the phase interpolator 214-2 may be 2:1. When the phase interpolators 214-1 and 214-2 sum up the two phase clocks CLK_2, which may be a clock signal with a 90 degree phase in one example, and CLK_3, which may be a clock signal with a 180 degree phase in one example, as two vectors, a new clock may be generated whose phase locates somewhere between CLK_2 and CLK_3. For example, a clock signal 402 illustrates the sum of the two phase clocks in the phase interpolator 214-1 and a clock signal 404 illustrates the sum of the two phase clocks in the phase interpolator 214-2. The difference 406 in phases between the two clock signals 402 and 404 may represent the desired delay in the time domain between the neighboring segments 106-1 and 106-2.

The rising and falling edges of the output of the phase interpolators 214-1 to 214-4 may be used to regulate the output of the respective DFFs 216-1 to 216-4. Referring back to FIG. 2, the outputs from the DFFs 216-1 to 216-4 may then be sent to the respective drivers 218-1 to 218-4. The drivers 218-1 to 218-4 may then deliver D1-D4 that are each delayed by an appropriate amount of time relative to a neighboring segment of time to a respective segment of the MZM.

Figure 3:
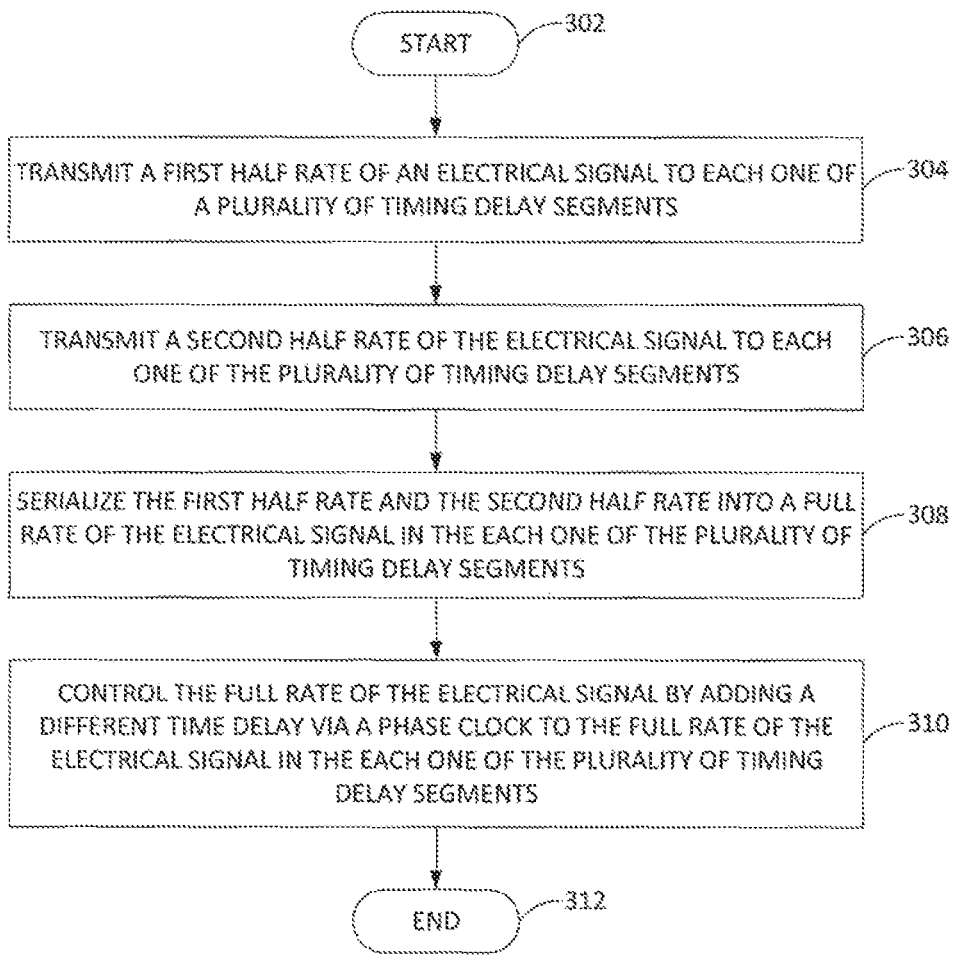
FIG. 3 is a flow diagram of an example method for controlling a signal in an MZM.

FIG. 3 illustrates a flow diagram of an example method 300 for controlling a signal in an MZM. In one example, the blocks of the method 300 may be performed by the apparatus 100 or 200.

At block 302, the method 300 begins. At block 304, the method 300 transmits a first half rate of an electrical signal to each one of a plurality of timing delay segments. For example, an electrical signal in an MZM may be divided into quarter rate lines. Two of the quarter rate lines may be fed into a first multiplexer that serializes the two quarter rate lines into the first half rate line.

At block 306, the method 300 transmits a second half rate of the electrical signal to the each one of the plurality of timing delay segments. As discussed above, an electrical signal in an MZM may be divided into quarter rate lines. The remaining two quarter rate lines may be fed into a second multiplexer that serializes the remaining two quarter rate lines into a second half rate line.

In one example, the second half rate line may be delayed by a half unit interval compared to the first half rate line. For example, the additional half unit interval may be applied by a re-timing buffer that includes a plurality of delay elements in the line.

At block 308, the method 300 serializes the first half rate and the second half rate into a full rate of the electrical signal in the each one of the plurality of timing delay segments. For example, each one of the plurality of timing delay segments may include a respective segment serializer that combines the first half rate line and the second half rate line into a full rate line.

At block 310, the method 300 controls the full rate of the electrical signal by adding a different time delay via a phase clock to the full rate of the electrical signal in the each one of the plurality of timing delay segments. In one example, each one of the timing delay segments may include a phase interpolator that applies a respective time delay for the respective timing delay segment. The delay may be applied by configuring the phase interpolator for each timing delay segment. For example, the phase interpolator can be configured with a ratio of weighting coefficients that are applied to phase clock lines of a phase clock that are coupled to the phase interpolator. In one implementation, the weighting coefficients are selected based on a measured delay within each one of the timing delay segments. The difference between the resulting phase of the phase interpolators of two adjacent timing delay segments may correspond to a desired delay in the time domain.

The delayed full rate lines may then be output to a respective driver of each one of the timing delay segments. The respective drivers may then output the delayed full rate lines to a respective segment of the MZM. At block 312, the method 300 ends.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

The invention claimed is:

1. An apparatus, comprising:
   a serializer;
   a re-timing buffer coupled to the serializer;
   a plurality of segments coupled to the re-timing buffer, wherein the plurality of segments is for controlling a timing of an electrical signal, wherein each one of the plurality of segments comprises:
      a segment serializer;
      a timing control coupled to the segment serializer; and
      a driver coupled to the timing control; and
   a phase clock coupled to the segment serializer and the timing control of each one of the plurality of segments.

2. The apparatus of claim 1, wherein the timing control comprises:
   a timing regulator; and
   a phase interpolator coupled to the timing regulator.

3. The apparatus of claim 2, wherein at least one line of the phase clock is coupled to the phase interpolator to add a delay to the electrical signal.

4. The apparatus of claim 2, wherein the phase interpolator of each one of the plurality of segments adds a different delay to the electrical signal.

5. The apparatus of claim 2, wherein the segment serializer of two or more of the plurality of segments is coupled to a different line of the phase clock.

6. A Mach Zehnder Modulator (MZM) driver, comprising:
   a first multiplexer for serializing first two quarter rates of an electrical signal into a first half rate of the electrical signal;
   a second multiplexer for serializing second two quarter rates of the electrical signal into a second half rate the electrical signal;

a delay coupled to the second multiplexer;
a plurality of timing delay segments receiving the first half rate and the second half rate for controlling a timing of the electrical signal; and
a phase clock having a plurality of different phase lines coupled to each one of the plurality of timing delay segments.

7. The MZM of claim 6, wherein the delay comprises half of a unit interval.

8. The MZM of claim 6, wherein each one of the plurality of timing delay segments comprises:
a segment multiplexer for serializing the first half rate and the second half rate into a full rate of the electrical signal;
a phase interpolator for introducing a timing delay to the full rate;
a dual-edge triggered flip flop coupled to the segment multiplexer and the phase interpolator; and
a driver coupled to the dual-edge triggered flip flop.

9. The MZM of claim 8, wherein the timing delay is based on two different phase lines of the phase clock coupled to the phase interpolator.

10. The MZM of claim 9, wherein the phase interpolator for each one of the plurality of timing delay segments applies a different weighting coefficient ratio to the two different phase lines coupled to the phase interpolator.

11. The MZM of claim 8, wherein the segment multiplexer of at least two different timing delay segments of the plurality of timing delay segments is coupled to two different phase lines of the phase clock.

12. A method, comprising:
transmitting a first half rate of an electrical signal to each one of a plurality of timing delay segments;
transmitting a second half rate of the electrical signal to the each one of the plurality of timing delay segments;
serializing the first half rate and the second half rate into a full rate of the electrical signal in the each one of the plurality of timing delay segments; and
controlling the full rate of the electrical signal by adding a different time delay via a phase clock to the full rate of the electrical signal in the each one of the plurality of timing delay segments.

13. The method of claim 12, comprising:
measuring a respective time delay in the each one of the plurality of timing delay segments before the controlling; and
configuring the each one of the plurality of timing delay segments in accordance with the respective time delay that is measured.

14. The method of claim 13, wherein the configuring comprises setting a different weighting coefficient ratio to at least one phase clock line of the phase clock in the each one of the plurality of timing delay segments.

15. The method of claim 12, wherein the different time delay for each timing delay segment of the plurality of timing segments is calculated based on a difference of a time the full rate of the electrical signal arrives at one of the plurality timing delay segments and a time the full rate of the electrical signal arrives at an adjacent one of the plurality of timing delay segments.

* * * * *